United States Patent [19]

Scannell et al.

[11] 4,253,062
[45] Feb. 24, 1981

[54] SHIELDED ELECTRICAL CURRENT INDICATING METER

[75] Inventors: Edward F. Scannell, Saugus; Edward D. Orth, Boxford, both of Mass.

[73] Assignee: General Electric Company, New York, N.Y.

[21] Appl. No.: 948,197

[22] Filed: Oct. 2, 1978

[51] Int. Cl.³ .............................................. G01R 1/20
[52] U.S. Cl. ................................. 324/150; 324/154 R
[58] Field of Search ............... 324/151 R, 151 A, 150, 324/154 R, 154 PB

[56] References Cited

U.S. PATENT DOCUMENTS

| | | | |
|---|---|---|---|
| 1,165,745 | 12/1915 | Benecke | 324/150 |
| 2,887,657 | 5/1959 | Lamb et al. | 324/154 R |
| 3,056,923 | 10/1962 | Parker | 324/150 |
| 3,621,393 | 11/1971 | Pigholet | 324/150 |
| 4,064,457 | 12/1977 | Boreas | 324/150 |

*Primary Examiner*—Michael J. Tokar
*Attorney, Agent, or Firm*—W. C. Bernkopf; P. L. Schlamp

[57] ABSTRACT

A compact and symmetrically arranged construction for electrical current indicating meters of small size. The meter construction comprises a concentrically pivoted coil which encircles a rounded magnetic fluxplate.

10 Claims, 4 Drawing Figures

SHIELDED ELECTRICAL CURRENT INDICATING METER

CROSS-REFERENCE TO RELATED APPLICATIONS

The subject application is related to the application of Carl F. Van Bennekom, Donald E. Rogers and Edward F. Scannell entitled Electrical Current Indicating Meter, filed Oct. 2, 1978, Ser. No. 948,173, and assigned to the same assignee as the subject application. This application also relates to the application of William J. Schultz and Carl F. Van Bennekom entitled Magnetic System For Electrical Current Indicating Meter, filed Oct. 2, 1978, Ser. No. 948,172, and assigned to the same assignee as the subject application.

This application further relates to the application of William J. Schultz and Carl F. Van Bennekom entitled Pivot Insert Method And Article, filed Oct. 2, 1978, Ser. No. 948,191, and assigned to the same assignee as the subject application.

Further this application relates to the application of Edward F. Scannell entitled Adjustable Spring Regulator For Setting Indicating Instrument Pointer, filed Oct. 2, 1978, Ser. No. 948,174, and assigned to the same assignee as the subject application.

Still further this application relates to the application of Edward F. Scannell and Donald E. Rogers entitled Means For Adjusting The Zero Point Setting Of A Meter filed Oct. 2, 1978, Ser. No. 948,171, and assigned to the same assignee as the subject application.

BACKGROUND OF THE INVENTION

The invention of this disclosure relates to small electrical current indicating meters of the general type disclosed in U.S. Pat. Nos. 3,621,393 and 4,064,457, and the references cited therein.

SUMMARY OF THE INVENTION

This invention comprises a new and improved, symmetrical construction for small sized electrical current indicating meters comprising a concentrically pivoted coil surrounding a rounded flux plate or disk which in combination provide greater versatility in the assembly and performance of the meter, and a reduction in thickness and overall size that enables the use of a multiplicity of meters arranged in close proximity to each other.

OBJECTS OF THE INVENTION

It is a primary object of this invention to provide a new construction for electrical current indicating meters which is more versatile and flexible in manufacture and service.

It is also an object of this invention to provide a small compact electrical current indicating meter constructed of cooperating units or components which simplify manufacture of parts and their assembly, and render the meter more effective and versatile in service.

It is a further object of this invention to provide an improved construction for electrical current indicating meters which renders it feasible and advantageous to amass or join a number thereof together in close proximity or contact for use without impairing their performance or accuracy due to interference from adjacent or stray magnetic fields, and without the need for added magnetic shields or insulation.

It is an additional object of this invention to provide a symmetrically arranged construction for an electrical current indicating meter having a concentrically pivoted coil surrounding a rounded flux plate or disk which enables the assembly of small meters of reduced thickness having increased flux induced torque forces with a high torque to weight factor, better balance or weight distribution and improved stability of the rotor assembly with an effective arc or swinging radii of up to 90°.

DESCRIPTION OF A PREFERRED EMBODIMENT

Figure 1:
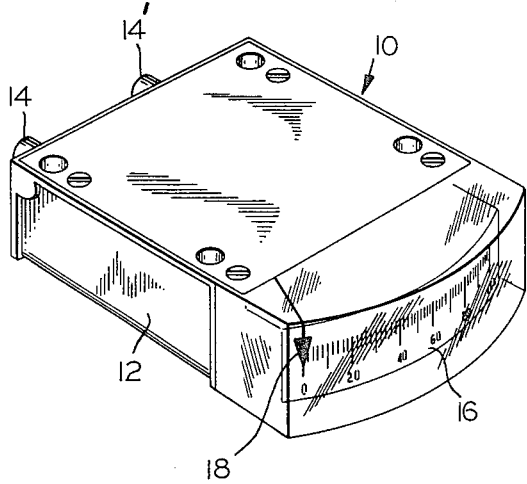
FIG. 1 is a perspective view of the electrical current indicating meter of this invention.
Figure 2:
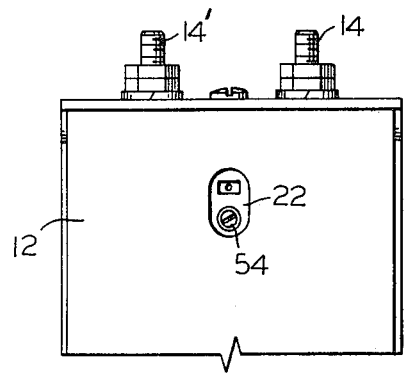
FIG. 2 is a partial bottom view of the meter of FIG. 1.

Referring to the drawings, FIG. 1 shows a meter product 10 of a preferred embodiment of this invention, comprising a housing 12, provided with terminals 14 and 14' for making electrical connections with the meter, and a visual scale 16 in association with a pointer 18 for indicating the measured quantity of electrical current determined by the meter.

Figure 3:
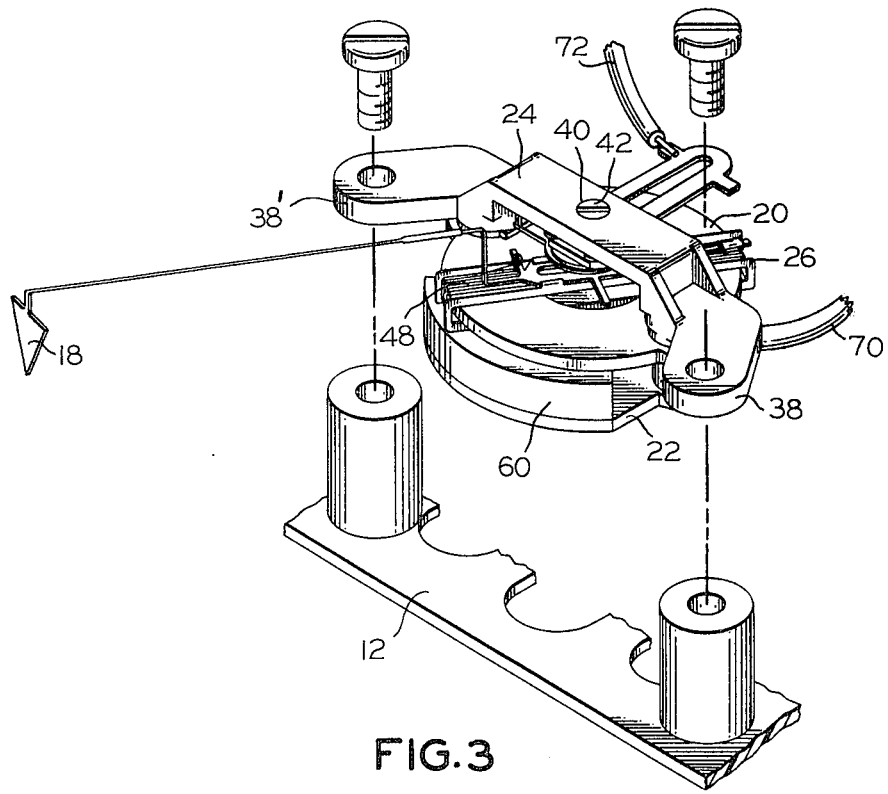
FIG. 3 is a partially exploded view showing the assemblage of the primary current indicating mechanism of the meter and the means for mounting same in a housing.
Figure 4:
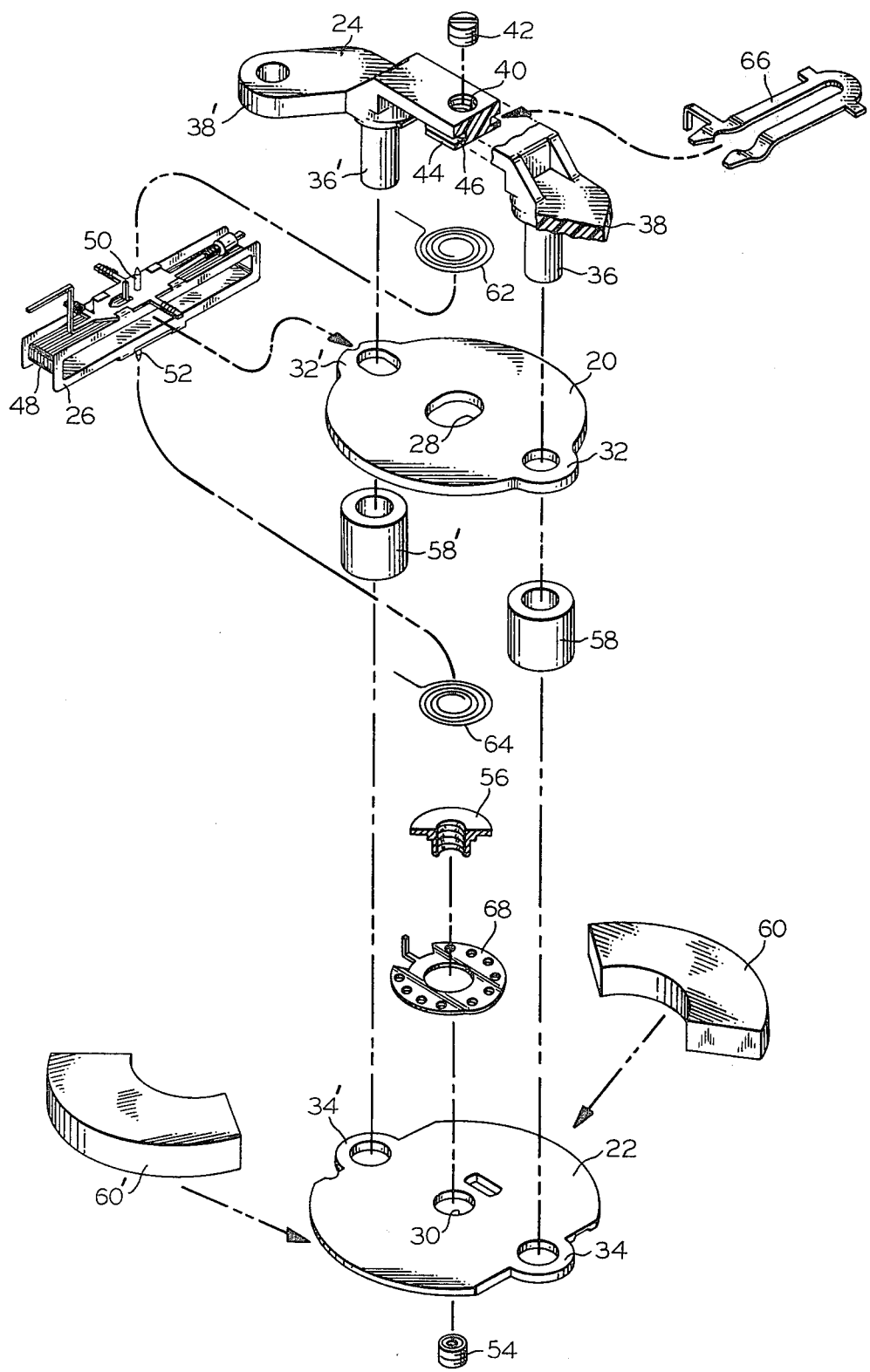
FIG. 4 is a fully exploded view of the primary current indicating mechanism.

The primary electrical current measuring mechanism, or the basic units therefore of a preferred embodiment of the meter construction of this invention, as shown in detail in FIGS. 3 and 4, comprises a pair of spaced apart, coplanar or parallel flux conducting, plates 20 and 22 formed from a disk-like or flat, ellipsoidal unit of a suitably magnetic flux conducting metal or "soft" magnetic material such as iron or soft steel; a frame member 24 formed of a non-magnetic material; and a rotor assembly 26.

Spaced apart, parallel metal disks or flux conducting plates 20 and 22 are each of a generally rounded or oval and flat configuration and of a substantially conterminous area with respect to each other. Plates 20 and 22 are also of a size or diameter to easily accommodate substantially within their intermediate perimeter one or a plurality of magnet units of various size or capacity. Each round or oval flux plate 20 and 22 is provided with a central orifice 28 and 30, respectively, and a pair of outward projecting perforated ears 32-32' and 34-34' for mounting in a predetermined spaced apart, parallel relationship with respect to each other, and the other components of the meter.

Frame member 24 is provided with a pair of generally parallel studs 36-36' which are arranged to align with and pass through the perforations in ears 32-32' and 34-34' of plates 20 and 22, respectively, and join and secure these components together in an appropriate spaced apart parallel relationship. Frame 24 is additionally preferably provided with a pair of laterally or outwardly extending arm 38-38', also perforated, for the mounting, such as with bolts, of the primary current measuring mechanism within a meter housing 12, or in an appropriate electrical device. Also, in the preferred embodiment, frame 24 is provided with a central orifice 40 suitable for receiving therein a jewel bearing 42, and can include an integrally molded or formed washer element 44 comprising a projecting portion or boss having a circumferential groove 46 thereabout for cooperation with a regulator or adjusting means. Frame member 24 can be formed from dielectric organic polymeric material, for example, a glass filled blend of polyphenylene oxide and polystyrene, such as General Electric Company's NOREL plastic.

Rotor assembly 26 comprises an electromagnetic coil 48 which is of apt dimensions and configuration to closely surround the ellipsoidal flux conducting plate 20, a pointer 18, and a pair of oppositely extending pivot shafts or staffs 50 and 52 for mounting the overall assembly 26 for rotational movement back and forth in an arcuate path in the same plane as the flux conducting plates 20 and 22. Pivots 50 and 52, respectively, extend to and rest in jewel bearings 42 and 54. Bearing 42, is threaded into frame member 24, and bearing 54 is threaded into a bushing 56 inserted in the central orifice 30 of flux conducting plate 22 which is mounted on studs 36–36' the furthest from frame member 24, in parallel relationship with flux plate 20. The pivot point of the coil 48 is approximately concentric with respect to the ellipsoidal parallel flux conducting plates 20 and 22 whereby the coil 48 and plates 20 and 22 are generally symmetrically arranged with respect to each other.

As shown in the drawings, in assembly, flux conducting plate 20 is mounted closest to frame member 24 with frame member studs 36–36' passing through the perforations or openings in its projecting ears 32–32', and flux conducting plate 22 is similarly mounted parallel thereto farthest from frame member 24 with studs 36–36' also passing through the perforations or openings of its projecting ears 34–34'. Spacing posts or cylinders 58–58' can be used surrounding studs 36–36' and positioned intermediate the parallel flux conducting plates 20 and 22 to provide a predetermined spacing between the plates. Thus, any required or desired distance between the pair of parallel flux conducting plates 20 and 22 can readily be unerringly achieved in assembly and positively maintained, or changed, by the use of spacing posts of appropriate dimensions or length. Spacing posts 58–58' can be composed either of magnetic flux conducting material such as ferrous metal, or a nonmagnetic material such as a dielectric plastic, depending upon the particular requirements or needs of the magnetic flux system or circuit employed.

One or more magnet bodies, including permanent magnets, such as the pair of counterposed permanent magnets 60–60' illustrated, are positioned intermediate the flux conducting plates 20 and 22 residing on the inner surface of plate 22 which is farthest from frame member 24, and there secured by any suitable means such as an adhesive. The number, configuration and positioning of magnets or magnet bodies should be arranged to attain optimum magnetic flux forces or strengths circulating through the flux system or circuit comprising flux conducting plates 20 and 22, and in turn past the electromagnetic coil 48 of rotor member 26. In a preferred embodiment two arcuate permanent magnets 60–60' are symmetrically deployed on each side of the generally concentric or central coil pivot point or pivot 52 with their polarity aptly aligned to produce a uniform flux field or fields of suitable direction(s) and intensity through the system. For example, the two magnets aligned with opposite polarity of N facing S are arranged on opposite sides of the central pivot point or pivot shaft 52 extending from the rotor assembly 26 to the bearing 54 affixed to the flux plate 22 farthest from the frame member 24.

The spacing between parallel flux conducting plates 20 and 22 is such as to provide a sufficient air gap or space between the magnet or magnets 60 positioned on the inner surface of flux plate 22, and the inner surface of flux plate 20 to aptly accommodate the free rotational movement of coil 48, or the intervening protion thereof, through the gap without contacting either the magnets or the flux conducting plates. Moreover, with the construction of this invention, the spacing between the flux plates 20 and 22 can easily be changed or standardized with spacing posts 58–58' of various predetermined lengths in order to aptly accommodate magnetic bodies of different dimensions without other changes in the structure.

Upper and lower control springs 62 and 64 bear against the rotor assembly 26 to appropriately bias its alignment and pointer 18 in relation to the scale 16, and to provide suitable torque resistance to rotary movement of the rotor assembly when induced by electromagnetic forces resulting from current flow through the coil, and thereafter return the rotor assembly and its pointer when the forces are terminated.

A regulator arm 66, which connects with washer element 44 of frame 24, is provided to adjust or synchronize the terminal position or setting of the rotor assembly 26 with its pointer 18 at a given indice, such as zero of the scale 16.

Also, an adjustable spring regulator disk 68 can be included to change the tension of the spring 64.

Electrical conductors for carrying current to the electrically sensitive or activatable meter components, such as the electromagnetic coil, for measurement, are provided by insulated wires 70 and 72 shown in FIG. 3. In a preferred embodiment, wires 70 and 72, respectively, connect terminals 14–14' with flux plate 22 and with regulator arm 66 which in turn makes electrical contact with the electromagnetic coil 48 through upper control spring 62.

The electrical current indicating and measuring meter mechanism or apparatus of this invention, as will be apparent to those skilled in this art, operates on the D'Arsonval principle which is well known and understood in the art, for instance, note the disclosure of U.S. Pat. Nos. 3,621,393 and 4,064,457.

However, the distinctive construction for the meter of this invention places the pivotal position and pivot means for the rotor assembly substantially intermediate the length of the electromagnetic coil and generally concentric with the flux plates, and it also provides for several magnet units symmetrically arranged around the pivotal position and the coil. Thus, the end portions of the electromagnetic coil extend approximately equally outward from the central pivotal position in opposite directions with each portion of the coil projecting over or into the area of influence or force of the flux field of one of the two, or more, magnet units. Then, by providing two, or multiples of two, so located magnet units arranged with polarities opposite each other, their respective magnetic flux inducing deflective force or influence acting upon each portion of the coil on opposite sides of the pivot point is in effect additive or accumulative with respect to the rotational force upon the rotatable electromagnetic coil and the rotor assembly carrying the same. In other words, the oppositely directed forces are so deployed on each side of the central pivotal point of the rotatable coil and symmetrical assembly so as to cooperate and thereby effectively double the rotating deflective force upon the coil, as well as balance the torque and mechanical pressures on the pivot structure.

The distinctive concentric construction and symmetrical arrangement of the components of the electrical current indicating meter of this invention, and in particular the use of a pair of generally rounded flux conducting plates or disks with a magnetic coil encircling one of said plates having a central pivot point with said plates, provides the meter mechanism with many advantages and improvements. For instance, the encircling magnetic coil cuts the lines of flux passing between the flux plates on both sides of the pivot therefor which increases the flux induced torque and increases the torque to weight factor of the unit. Moreover, the center pivoting coil of the rotor assembly, or mechanical symmetry thereof, provides for better balance of the assembly with evener weight distribution that minimizes lateral forces inducing deflection or wobbling of the rotor assembly and its pointer. Also, the construction and arrangement with the pivot bearing located in the upper frame and the furthest flux plate provides a maximum distance therebetween within the dimensions of the meter housing whereby greater stability or freedom from play in the pointer arm is attained, even in a very small sized meter unit. The overall construction and arrangement of this invention additionally enables the rotor assembly to travel in an arc or radius of maximum distance of up to 90°.

Significantly the ellipsoidal or rounded configuration of the pair of flux conducting plates enable the use of multiple magnet units and varied arrangements thereof whereby each flux plate can be provided with both North and South polarities which enhances their magnetic shielding effects, enabling the practical positioning of several such meters in close proximity or in contact with each other such as stacking one on another without the need for additional magnetic shield members. Also the distance between the pair of parallel mounted flux conducting plates can conveniently be adjusted to accept various sized and types of magnets, and the flux plates are easily manufactured by metal stamping techniques.

What we claim as new and desire to secure by Letters Patent of the United States is:

1. An electrical current indicating meter mechanism comprisng:
    (a) an inner and an outer parallel magnetic flux conducting plate;
    (a') a pair of spacer posts;
    (b) a frame member having a pair of parallel projecting studs for securing thereto the inner and outer flux plates, wherein said inner flux plate is mounted on said studs first, with the flux plates spaced apart by said pair of spacer posts;
    (c) a rotor assembly having a coil surrounding the inner flux conducting plate and being centrally mounted thereabout for rotational movement in the same plane as the inner flux plate on a pair of pivots with one of said pivots extending to a bearing affixed to the outer flux plate;
    (d) a permanent magnet positioned between spaced apart flux plates on the inner surface of the outer flux plate; and
    (e) means for supplying current to the coil of the rotor assembly.

2. An electrical current indicating meter mechanism, comprising:
    (a) an inner and an outer parallel magnetic flux conducting plate;
    (a') a pair of spacer posts;
    (b) a frame member having a pair of parallel extending studs for securing thereto the inner and outer flux plates, wherein said inner flux plate is mounted on said studs first, with the flux plates spaced apart by said pair of spacer posts;
    (c) a rotor assembly having an electromagnetic coil surrounding the inner flux conducting plate and being mounted for rotational movement back and forth in the same plane as the inner flux plate on a pair of oppositely extending pivots with one resting in a bearing affixed to the frame member and the other resting in a bearing affixed to the outer flux plate;
    (d) a plurality of magnet bodies positioned between the spaced apart flux plates on the inner surface of the outer flux plate; and
    (e) means for supplying current to the coil of the rotor.

3. An electrical current indicating meter mechanism comprising:
    (a) an inner and an outer parallel flux conducting metal plate of substantially the same size;
    (a') a pair of spacer posts;
    (b) a frame member of non-magnetic material and having a pair of parallel projecting studs for securing thereto the inner and outer flux plates, wherein said inner flux plate is mounted on said studs first, with the flux plates spaced apart by said pair of spacer posts;
    (c) a rotor assembly having an electromagnetic coil surrounding the inner flux conducting plate and being mounted for rotational movement back and forth in an arcuate path in the same plane as the inner flux conducting plate on a pair of oppositely extending pivots with one resting in a bearing affixed to the frame member and the other resting in a bearing affixed to the outer flux conducting plate;
    (d) a plurality of magnet bodies positioned between the spaced apart flux plates on the inner surface of the outer flux plate; and
    (e) means for supplying current to the electromagnetic coil of the rotatably mounted rotor assembly.

4. The meter mechanism of claim 2 or 3, wherein a pair of arcuate shaped permanent magnets are positioned between the spaced apart flux plates on the inner surface of the outer flux plate.

5. An electrical current indicating meter mechanism comprising:
    (a) an inner and an outer parallel flux conducting metal plate of substantially the same size;
    (a') a pair of spacer posts;
    (b) a frame member of non-magnetic material and having a pair of parellel projecting studs for securing thereto the inner and outer flux plates wherein said inner flux plate is mounted on said studs first, with the flux plates spaced apart by said spacer posts, and having an orifice for mounting a bearing therein;
    (c) a rotor assembly having an electromagnetic coil surrounding the inner flux conducting plate and being mounted for rotational movement back and forth in an arcuate path in the same plane as the flux conducting plates on a pair of oppositely extending pivots with one resting in a bearing affixed to the frame member in the orifice therein and the other pivot resting in a bearing affixed to the outer flux conducting plate;

(d) a pair of arcuate magnet bodies symmetrically positioned between the spaced apart flux conducting plates on the inner surface of the outer flux conducting plate with the magnet bodies located on opposite sides of the pivot extending from the rotor assembly to the bearing affixed to the outer flux plate; and (e) means for supplying current to the electromagnetic coil of the rotatably mounted rotor assembly.

6. An electrical current indicating meter mechanism comprisng:

(a) an inner and an outer parallel magnetic flux conducting steel plate of a generally ellipsoidal configuration having a central orifice therein and of substantially the same size;

(a') a pair of spacer posts;

(b) a frame member of non-magnetic material having a pair of parallel projecting studs for securing thereto the inner and outer flux plates, wherein said inner flux plate is mounted on said studs first, with the flux plates spaced apart by said pair of spacer posts and said frame member having an orifice for mounting a bearing therein;

(c) a rotor assembly having an electromagnetic coil surrounding the inner flux conducting plate and being centrally mounted for rotational movement back and forth in an arcuate path in the same plane as the inner flux conducting plate on a pair of oppositely extending pivots concentrically positioned with respect to the flux conducting plates and with one of said pivots resting on a bearing affixed to the frame member in the central orifice therein and the other pivot resting in a bearing affixed in the central orifice of the outer flux conducting plate;

(d) a pair of arcuate magnet bodies symmetrically positioned between the spaced apart flux conducting plates on the inner surface of the outer flux conducting plate with the magnet bodies located on opposite sides of the concentric pivot extending from the rotor assembly to the bearing affixed in the central orifice of the outer flux plate; and (e) means for supplying current to the electromagnetic coil of the rotatably mounted rotor assembly.

7. The meter mechanism of claim 1, 2, 3 or 5, wherein the inner and outer parallel magnetic flux conducting plates are each of a generally ellipsoidal configuration.

8. The meter mechanism of claim 1 or 2 wherein the inner and outer parallel magnetic flux conducting plates are substantially the same size.

9. The meter mechanism of claim 1 or 2 wherein a pair of magnets are positioned symmetrically on the inner surface of the outer flux plate.

10. The meter mechanism of claim 1, 2 or 3 wherein two magnets are located on opposite sides of the pivot extending from the rotor assembly to the bearing affixed to the outer flux plate.

* * * * *